(12) United States Patent
Chang

(10) Patent No.: US 9,070,030 B2
(45) Date of Patent: Jun. 30, 2015

(54) MANAGEMENT SYSTEM FOR CONTAINER DATA CENTER

(71) Applicant: HON HAI PRECISION INDUSTRY CO., LTD., New Taipei (TW)

(72) Inventor: Yao-Ting Chang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 52 days.

(21) Appl. No.: 13/875,322

(22) Filed: May 2, 2013

(65) Prior Publication Data
US 2013/0321132 A1 Dec. 5, 2013

(30) Foreign Application Priority Data
May 29, 2012 (TW) .............................. 101119222 A

(51) Int. Cl.
*G06Q 10/00* (2012.01)
*G06K 7/10* (2006.01)
*H05K 7/14* (2006.01)

(52) U.S. Cl.
CPC .......... *G06K 7/10366* (2013.01); *H05K 7/1498* (2013.01); *G06Q 10/20* (2013.01)

(58) Field of Classification Search
CPC .............................. G06Q 10/20; H05K 7/1498
USPC ..................... 340/10.1, 10.4, 10.41
See application file for complete search history.

(56) References Cited

U.S. PATENT DOCUMENTS

| | | | |
|---|---|---|---|
| 8,803,660 B2* | 8/2014 | Martin et al. | 340/10.1 |
| 2004/0243280 A1* | 12/2004 | Bash et al. | 700/245 |
| 2009/0198388 A1* | 8/2009 | Hillis | 700/300 |
| 2011/0047263 A1* | 2/2011 | Martins et al. | 709/224 |
| 2011/0084839 A1* | 4/2011 | Groth et al. | 340/572.1 |
| 2011/0235577 A1* | 9/2011 | Hintermeister et al. | 370/328 |
| 2011/0248823 A1* | 10/2011 | Silberbauer et al. | 340/10.1 |
| 2012/0275084 A1* | 11/2012 | Familiant et al. | 361/601 |
| 2013/0046410 A1* | 2/2013 | Hsieh et al. | 700/277 |
| 2013/0262170 A1* | 10/2013 | Cordio et al. | 705/7.15 |

* cited by examiner

*Primary Examiner* — Andrew Bee
(74) *Attorney, Agent, or Firm* — Novak Druce Connolly Bove + Quigg LLP

(57) ABSTRACT

A management system for a container data center (CDC) includes at least one radio frequency identification (RFID) tag, a reader, a processor, an antenna module, and a wireless communication device. The RFID tag pre-stores data as to a manager of the CDC or electronic devices received in the CDC. The reader reads the data from the RFID tag, and outputs the data to the processor. The processor outputs a processing result according to the data, to the antenna module. The antenna module sends the processing result to the wireless communication device via a wireless communication system.

14 Claims, 2 Drawing Sheets

MANAGEMENT SYSTEM FOR CONTAINER DATA CENTER

BACKGROUND

1. Technical Field

The disclosure generally relates to management systems, and particularly relates to a management system for a container data center (CDC).

2. Description of the Related Art

A container data center (CDC) usually includes servers, network equipment, storage devices, power supplies, and other electronic components. In order to manage the CDC, at least one alarm device is located in the CDC. However, since the alarm device has a single function, it is very inconvenient for managers of the CDC to have to continuously refer to the alarm device.

Therefore, there is room for improvement within the art.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present embodiments.

DETAILED DESCRIPTION

Figure 1:
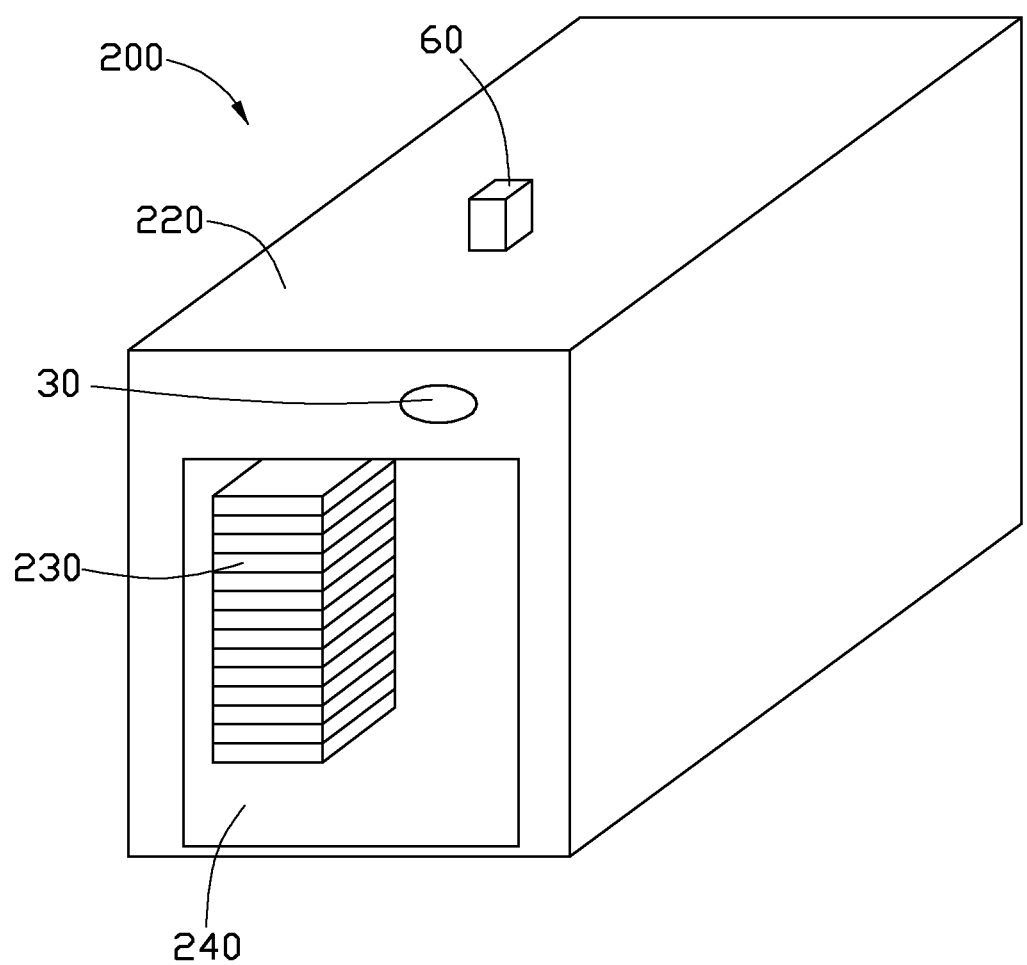
FIG. 1 is schematic view of a container data center (CDC), according to an exemplary embodiment.
Figure 2:
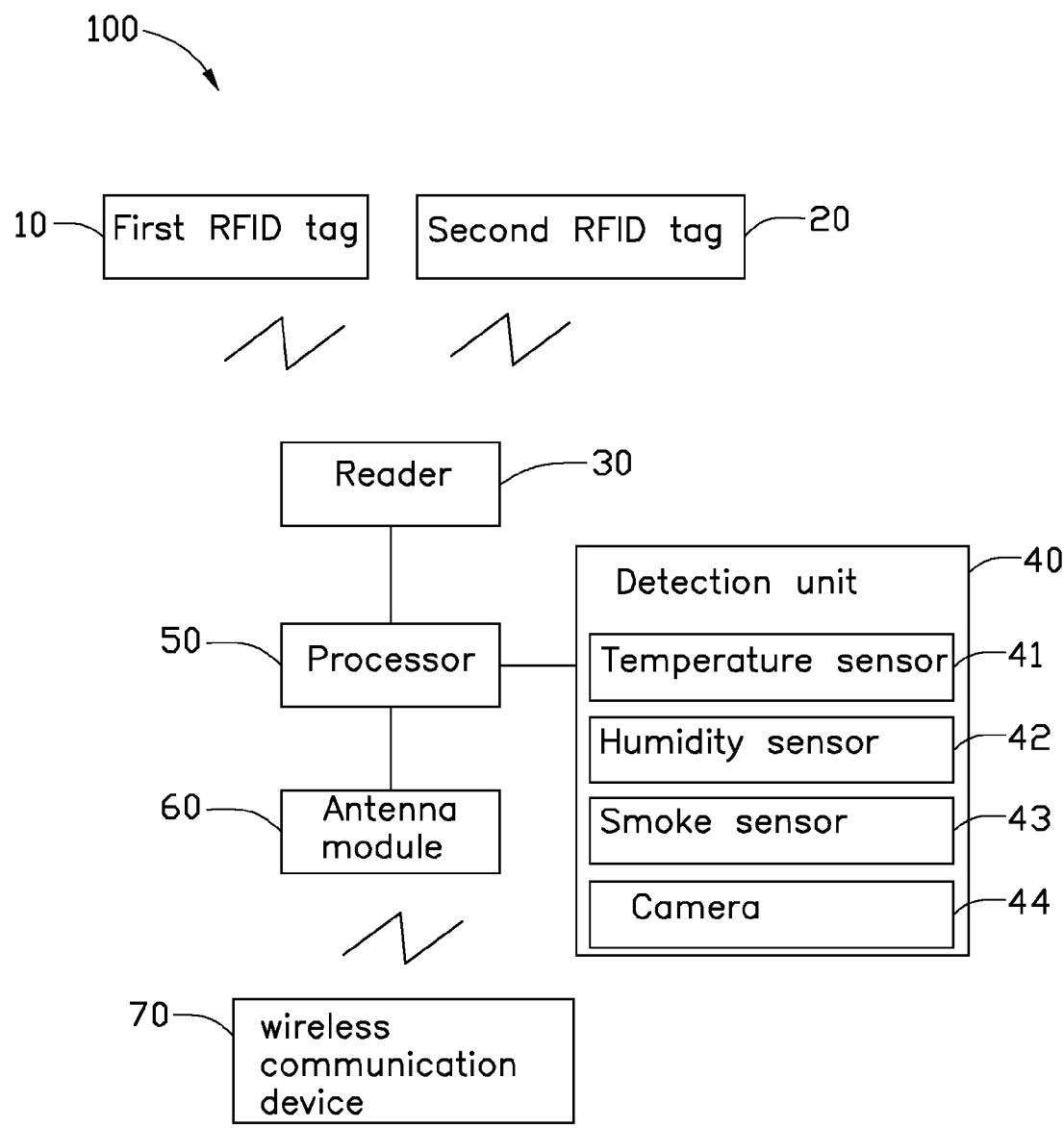
FIG. 2 is block diagram of a management system for the CDC of FIG. 1, according to an exemplary embodiment.

FIGS. 1-2 show a management system 100, which is used to manage a container data center (CDC) 200.

In FIG. 1, in one embodiment, the CDC 200 includes a housing 220, and a plurality of electronic devices 230 received in the housing 220. The plurality of electronic devices 230 can be servers, network equipment, storage devices, power supplies, and other electronic components. The housing 220 includes an entrance 240, and the plurality of electronic devices 230 can be put in or taken out from the CDC 200 via the entrance 240.

In FIG. 2, the management system 100 includes a first radio frequency identification (RFID) tag 10, a second RFID tag 20, a reader 30, a detection unit 40, a processor 50, an antenna module 60, and a wireless communication device 70.

The first RFID tag 10 is attached to the electronic device 230, and communicates with the reader 30. The first RFID tag 10 pre-stores a first identification code of the electronic device 230, such as name, production date, maintenance records, and a location in the housing 220.

The second RFID tag 20 is allocated to a manager of the CDC 200, and communicates with the reader 30. For example, the second RFID tag 20 can be attached to an ID card (e.g., employee's card) of the manager, and pre-stores a second identification code of the manager, such as name, and ID number.

The reader 30 can be positioned above the entrance 240 or other suitable locations, to read the first identification code from the first RFID tag 10 and the second identification code from the second RFID tag 20. The reader 30 includes a real-time clock (RTC) circuit (not shown). When the reader 30 reads the first identification code or the second identification code, the RTC circuit outputs a RTC signal. For example, when the electronic device 230, which has been repaired three times, is put in the CDC 200 via the entrance 240, the reader 30 reads the first identification code from the first RFID tag 10 to obtain the repair records, and outputs the RTC signal corresponding to a time of the electronic device 230 entering the entrance 240. When the manager taking the second RFID tag 20 enters the CDC 200 via the entrance 240, the reader 30 reads the second identification code from the second RFID tag 20 to obtain the name and the ID number of the manager, and outputs the RTC signal corresponding to a time of the manager entering the entrance 240.

In addition, the reader 30 is electronically connected to the processor 50, to transmit the first identification code, the second identification code, and the RTC signal to the processor 50.

The detection unit 40 is located in the housing 200 to collect a variety of data of the CDC 200. In one embodiment, the detection unit 40 includes a temperature sensor 41, a humidity sensor 42, a smoke sensor 43, and a camera 44. The temperature sensor 41, the humidity sensor 42, and the smoke sensor 43 respectively collect temperature data, humidity data, and smoke data of the CDC 200. The camera 44 captures image data of the CDC 200. Additionally, the detection unit 40 is electronically connected to the processor 50, to transmit the variety of data to the processor 50.

In other exemplary embodiments, the detection unit 40 further includes other sensors, such as a airflow sensor, for example.

The processor 50 is located in the housing 200 to process data transmitted from the reader 30 and the detection unit 40, and output a processing result. For example, if the first identification code transmitted from the reader 30 represents "the production date of the electronic device 230 is in 2008", the processor 50 determines whether the service life of the electronic device 230 is greater than a predetermined time (e.g., five years), and outputs a processing result when the service life of the electronic device 230 exceeds the predetermined time. For another example, if the manager enters the CDC 200 at 16:00, and leaves from the CDC 200 at 17:00, the processor 50 determines that the manager stayed in the CDC 200 is about one hour. For another example, if a real-time temperature of the CDC 200 transmitted from the temperature sensor 41 is about 35 degrees, the processor 50 determines whether the real-time temperature is greater than a predetermined temperature (e.g., 25 degrees), and outputs a processing result indicating whether the real-time temperature is normal or abnormal. In other examples, the processor 50 is further used to process the smoke data of the CDC 200 transmitted from the smoke sensor 43, or record the number of repairs of the electronic device 230, and so on.

The processor 50 is electronically connected to the antenna module 60 to output the processing result to the antenna module 60. The antenna module 60 can be positioned outside the housing 220, and is configured to send the processing result to the wireless communication device 70 via a wireless communication system. In one embodiment, the wireless communication device 70 is a mobile phone, and is allocated to the manager of the CDC 200. The manager can directly obtain the processing result via the wireless communication device 70.

In use, the reader 30 reads the first identification code from the first RFID tag 10 and the second identification code from the second RFID tag 20, and generates the RTC signal accordingly. The reader 30 transmits the first identification code, the second identification code, and the RTC signal to the processor 50. Additionally, the detection unit 40 collects the variety of data of the CDC 200, and transmits the variety of data to the processor 50. The processor 50 processes data transmitted from the reader 30 and the detection unit 40, and then outputs the processing result to the antenna module 50. The antenna module 50 sends the processing result to the wireless communication device 70 to inform the manager.

In other exemplary embodiments, one of the first RFID tag 10 and the second RFID tag 20 can be omitted.

In summary, the reader 30 can read the first identification code from the first RFID tag 10 and the second identification code from the second RFID tag 20, and the detection unit 40 can collect data concerning the CDC 200. Thus, more items of the CDC 200 can be monitored and can be monitored more often. Additionally, the processing result can be sent to the wireless communication device 70 via the antenna module 60, thus, the manager can directly obtain full details as to status of the CDC 200, and remote monitoring can be achieved.

It is to be understood, however, that even though numerous characteristics and advantages of the exemplary disclosure have been set forth in the foregoing description, together with details of the structure and function of the exemplary disclosure, the disclosure is illustrative only, and changes may be made in detail, especially in the matters of shape, size, and arrangement of parts within the principles of the exemplary disclosure to the full extent indicated by the broad general meaning of the terms in which the appended claims are expressed.

What is claimed is:

1. A management system for a container data center (CDC), the CDC comprising a plurality of electronic devices, the management system comprising:
   at least one radio frequency identification (RFID) tag pre-storing data for a manager of the CDC or for the electronic devices, wherein the at least one RFID tag includes a first RFID tag, the first RFID tag pre-stores a first identification code including name, production date, maintenance records, and locations of the electronic devices;
   a reader reading the data from the at least one RFID tag;
   a processor electronically connected to the reader;
   an antenna module electronically connected to the processor; and
   a wireless communication device allocated to the manager of the CDC;
   wherein the reader outputs the data to the processor, the processor outputs a processing result according to the data, to the antenna module; the antenna module sends the processing result to the wireless communication device via a wireless communication system.

2. The management system as claimed in claim 1, wherein the processor determines whether a service life of the electronic device is greater than a predetermined time, and outputs the processing result when the service life of the electronic device exceeds the predetermined time.

3. The management system as claimed in claim 1, wherein the at least one RFID tag includes a second RFID tag, the second RFID tag is allocated to the manager, and pre-stores a second identification code of the manager.

4. The management system as claimed in claim 3, wherein the second identification code includes name and ID number of the manager.

5. The management system as claimed in claim 1, further comprising a detection unit electronically connected to the processor, wherein the detection unit collects data of the CDC, and transmits the data to the processor, the processor processes the data, and outputs a processing result to the antenna module.

6. The management system as claimed in claim 5, wherein the detection unit includes a temperature sensor, a humidity sensor, and a smoke sensor, the temperature sensor, the humidity sensor, and the smoke sensor collect temperature data, humidity data, and smoke data of the CDC, respectively.

7. The management system as claimed in claim 6, wherein the processor determines whether a real-time temperature collected by the temperature sensor is greater than a predetermined temperature, and outputs the processing result when the real-time temperature is greater than the predetermined temperature.

8. The management system as claimed in claim 5, wherein the detection unit includes a camera to capture image data of the CDC.

9. A management system for obtaining and transmitting data from at least one radio frequency identification (RFID) tag about a container data center (CDC) to a wireless communication device allocated to a manager of the CDC, the CDC comprising a plurality of electronic devices, the at least one RFID tag pre-storing data as to the manager of the CDC or as to the electronic devices, the management system comprising:
   a reader reading the data from the at least one RFID tag;
   a processor electronically connected to the reader; and
   an antenna module electronically connected to the processor;
   wherein the at least one RFID tag includes a first RFID tag, the first RFID tag pre-stores a first identification code including name, production date, maintenance records, and locations of the electronic devices;
   wherein the reader outputs the data to the processor, the processor outputs a processing result according to the data, to the antenna module; the antenna module sends the processing result to the wireless communication device via a wireless communication system.

10. The management system as claimed in claim 9, wherein the at least one RFID tag includes a second RFID tag, the second RFID tag is allocated to the manager, and pre-stores a second identification code of the manager.

11. The management system as claimed in claim 9, further comprising a detection unit electronically connected to the processor, wherein the detection unit collects data of the CDC, and transmits the data to the processor, the processor processes the data, and outputs a processing result to the antenna module.

12. The management system as claimed in claim 11, wherein the detection unit includes a temperature sensor, a humidity sensor, and a smoke sensor, the temperature sensor, the humidity sensor, and the smoke sensor collect temperature data, humidity data, and smoke data of the CDC, respectively.

13. The management system as claimed in claim 11, wherein the detection unit includes a camera to capture image data of the CDC.

14. The management system as claimed in claim 9, wherein the processor determines whether a service life of the electronic device is greater than a predetermined time, and outputs the processing result when the service life of the electronic device exceeds the predetermined time.

* * * * *